(12) United States Patent
Wang et al.

(10) Patent No.: US 12,312,687 B2
(45) Date of Patent: May 27, 2025

(54) POWDER COATING DEVICE

(71) Applicant: XIAMEN YUNMAO TECHNOLOGY CO., LTD, Xiamen (CN)

(72) Inventors: Yunyu Wang, Xiamen (CN); Maosheng Zhao, Xiamen (CN); Tong Wang, Xiamen (CN); Yanfeng Liu, Xiamen (CN)

(73) Assignee: XIAMEN YUNMAO TECHNOLOGY CO., LTD, Xiamen (CN)

( * ) Notice: Subject to any disclaimer, the term of this patent is extended or adjusted under 35 U.S.C. 154(b) by 473 days.

(21) Appl. No.: 17/962,499

(22) Filed: Oct. 8, 2022

(65) Prior Publication Data

US 2023/0037732 A1 Feb. 9, 2023

Related U.S. Application Data

(63) Continuation-in-part of application No. PCT/CN2021/000063, filed on Apr. 8, 2021, and a continuation-in-part of application No. PCT/CN2021/000064, filed on Apr. 8, 2021.

(30) Foreign Application Priority Data

Apr. 8, 2020 (CN) .......................... 202020503484.2
Apr. 8, 2020 (CN) .......................... 202020517437.3

(51) Int. Cl.
*C23C 16/455* (2006.01)

(52) U.S. Cl.
CPC .. *C23C 16/45551* (2013.01); *C23C 16/45561* (2013.01)

(58) Field of Classification Search
CPC .......................... C23C 16/4417; C23C 16/442
See application file for complete search history.

(56) References Cited

U.S. PATENT DOCUMENTS

2004/0052984 A1* 3/2004 Toth ........................ C23C 24/06
428/34.1
2004/0255858 A1* 12/2004 Lee ................... C23C 16/45544
118/715

FOREIGN PATENT DOCUMENTS

CN 204058588 * 12/2014

OTHER PUBLICATIONS

Chen, CN204058588, Dec. 2014, Eng Mach translation (Year: 2014).*

* cited by examiner

*Primary Examiner* — Joseph A Miller, Jr.

(57) ABSTRACT

A powder coating device includes a reaction device, a driving device, a gas supply device, and a gas delivery device. The gas delivery device includes a rotating shaft and a sleeve. The rotating shaft is connected to an inner cylinder and the driving device, and a first gas path communicated with a reaction chamber is defined along an axis of the rotating shaft, and a plurality of gas holes for communicating the first gas path with outside of the rotating shaft are defined in the rotating shaft. The sleeve is sleeved on the rotating shaft, and a second gas path for the rotating shaft to pass through is defined in the sleeve, the second gas path is communicated with the gas supply device, and the plurality of the gas holes is located inside the second gas path.

9 Claims, 6 Drawing Sheets

POWDER COATING DEVICE

TECHNICAL FIELD

The present disclosure relates to a technical field of powder coating, and in particular to a powder coating device.

BACKGROUND

Powder coating is achieved by surface chemical reactions, where the surface chemical reactions generally include three methods of mechanical stirring fusion method, chemical solution reaction method, and gas phase reaction method, and the gas phase reaction method mainly includes Atomic Layer Deposition (ALD), Chemical Vapor Deposition (CVD), and Molecular Layer Deposition (MLD).

Powder coating devices are a common device for performing powder coating by the gas phase reaction method. At present, the powder coating devices each generally includes a fixed outer supporting cylinder and a rotatable inner reaction cylinder as a reaction device, and a gas supply device and a gas extraction device are communicated with an inner cavity of the outer supporting cylinder for transporting reactive gas, and the reactive gas freely diffuses into a reaction cavity of the inner cylinder after entering the inner cavity of the outer supporting cylinder, and reacts on surfaces of powders to form a coating layer.

Such connecting structure of the power coating devices results in that the gas cannot enter the inner reaction cylinder quickly after entering the inner cavity of the outer supporting cylinder, thereby resulting in uneven quality of final products. Especially when the reactive gas has a low vapor pressure, the reactive gas cannot even enter the inner reaction cylinder. In addition, current cavity wall structures generally have a simple structure, which is not beneficial for equipment upgrading, and does not work well to guarantee effect of powder coating.

It can be understood that the powder coating device can be applied to other elements to-be-coated besides the powders, for example, parts, bearings, screws and other workpieces, or pharmaceutical particles, or other three-dimensional objects.

In view of this, applicant hereby proposes the present disclosure after studying prior arts.

SUMMARY

The present disclosure provides a powder coating device, aiming to solve at least one of the above-mentioned problems.

To solve at least one of the above-mentioned problems, the present disclosure provides a powder coating device including a reaction device, a driving device, a gas supply device, and a gas delivery device configured to connect an inner cylinder of the reaction device and the driving device and to connect a reaction chamber of the inner cylinder and the gas supply device.

The gas delivery device includes a rotating shaft, a sleeve and a pair of seals. The rotating shaft is connected to the inner cylinder and the driving device, and a first gas path communicated with the reaction chamber is defined along an axis of the rotating shaft, and a plurality of gas holes for communicating the first gas path with outside of the rotating shaft are defined in the rotating shaft. The sleeve is sleeved on the rotating shaft, and a second gas path for the rotating shaft to pass through is defined in the sleeve, and the second gas path is communicated with the gas supply device, and the plurality of the gas holes is located inside the second gas path, and the pair of the seals are disposed between the rotating shaft and the sleeve for sealing the second gas path.

The rotating shaft is rotatable with respect to the sleeve and is capable of driving the inner cylinder to rotate, and gas from the gas supply device is capable of entering the first gas path from the second gas path after passing through the plurality of the gas holes, and then entering the reaction chamber.

By adopting the above-mentioned technical scheme, the present disclosure can obtain the following technical effects:

In the powder coating device of the present disclosure, the reactive gas and precursor gas from the gas supply device can directly enter the reaction chamber inside the inner cylinder, so as to ensure that the reactive gas can fully react on surfaces of powders, thereby achieving good practical effects, which provides great practical significance. Further, the gas delivery device can not only connect the driving device and the inner cylinder of the reaction device to transmit power of the driving device to the inner cylinder to rotate the inner cylinder, but also communicate with the gas supply device, so that the reactive gas and precursor gas from the gas supply device can directly enter the reaction chamber inside the inner cylinder, so as to ensure that the reactive gas can fully react on surfaces of powders, thereby achieving good practical effects.

The reaction device of the powder coating device adopts a double-layer cavity wall structure. The gas inlet pipeline can be disposed between the inner wall and the outer wall, or inside the inner wall, which can ensure cleanliness inside the cavity and is very convenient for installation and maintenance of the powder coating device. Meanwhile, the powder coating device includes a vacuum layer inside or a heat insulating layer as an outer layer, which can well prevent heat inside the cavity wall structure from conducting to outside, thereby reducing heat loss, making temperature controlling inside the cavity wall structure more accurate, greatly improving effect of powder coating, and providing great practical significance.

BRIEF DESCRIPTION OF DRAWINGS

In order to illustrate the technical solutions of the examples of the present disclosure more clearly, the drawings used in the embodiments are briefly introduced below, it should be understood that, the following drawings merely show some examples of the present disclosure, and should not be viewed as limiting the scope, and persons of ordinary skill in the art, without creative efforts, can still obtain other relevant drawings according to these drawings.

REFERENCE NUMBER

1—rotating shaft, 2—seal, 3—sleeve, 4—first gas path, 5—gas hole, 6—second gas path, 7—inner cylinder, 8—coupling, 9—reaction chamber, 10—reaction device, 11—gas delivery device, 12—driving device, 13—gas supply device, 14—gas extraction pipeline, 15—gas extraction device, 16—valve, 17—outer wall, 18—inner wall, 19—vacuum layer, 20—heating component, 21—cavity, 22—gas inlet pipeline.

DETAILED DESCRIPTION OF PREFERRED EMBODIMENTS

In order to make the objects, technical solutions and advantages of the examples of the present disclosure clearer, the technical solutions in the examples of the present disclosure will be described below clearly and completely in combination with the figures in the examples of the present disclosure. Apparently, the examples described are merely some of, not all of the examples of the present disclosure. Based on the examples of the present disclosure, all the other examples obtained by persons of ordinary skill in the art without any creative efforts, shall fall within the protection scope of the present disclosure. Therefore, the following detailed description below of the examples of the present disclosure provided in the figures is not intended to limit the scope of the present disclosure as claimed herein, but merely illustrates chosen examples of the present disclosure. Based on the examples of the present disclosure, all the other examples obtained by persons of ordinary skill in the art without any creative efforts, shall fall within the protection scope of the present disclosure.

Figure 1:
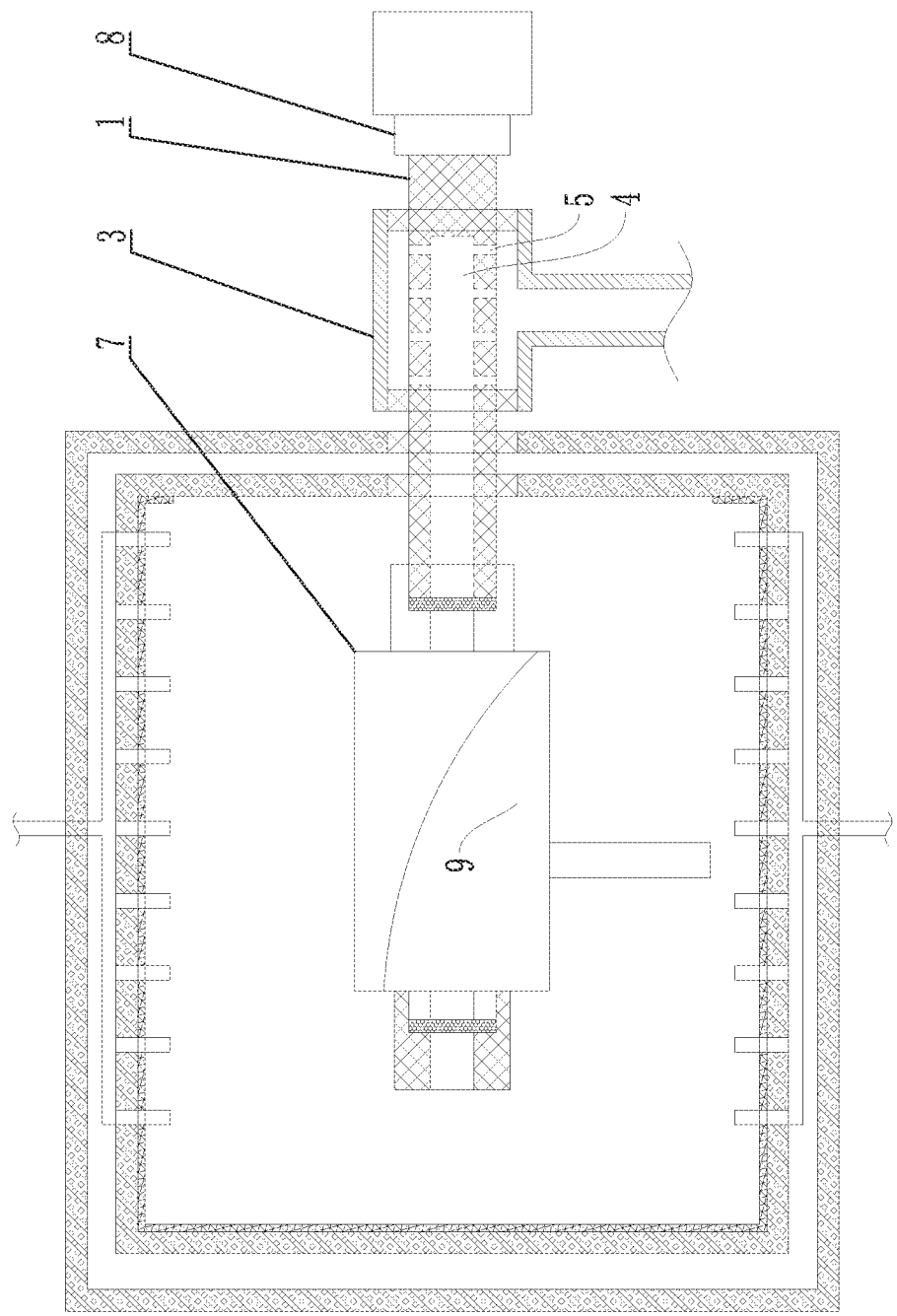
FIG. 1 is a structural schematic diagram of a gas delivery device in a powder coating device according to one embodiment of the present disclosure.
Figure 2:
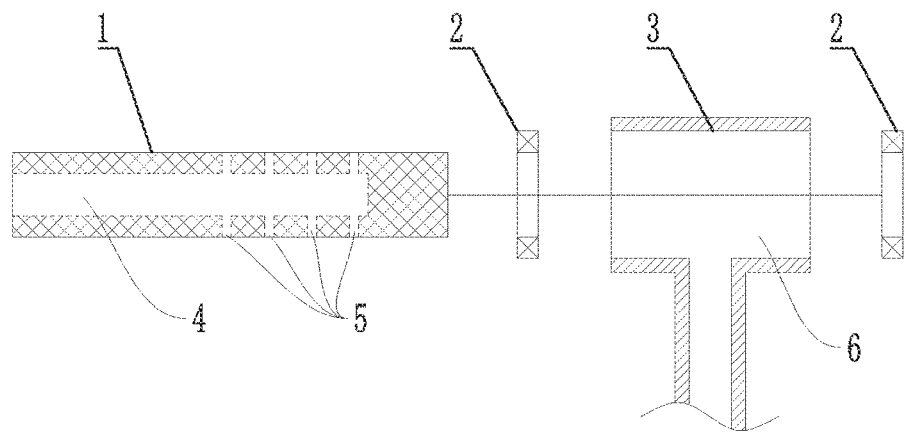
FIG. 2 is an exploded diagram of the gas delivery device (half-sectional view) according to one embodiment of the present disclosure.
Figure 3:
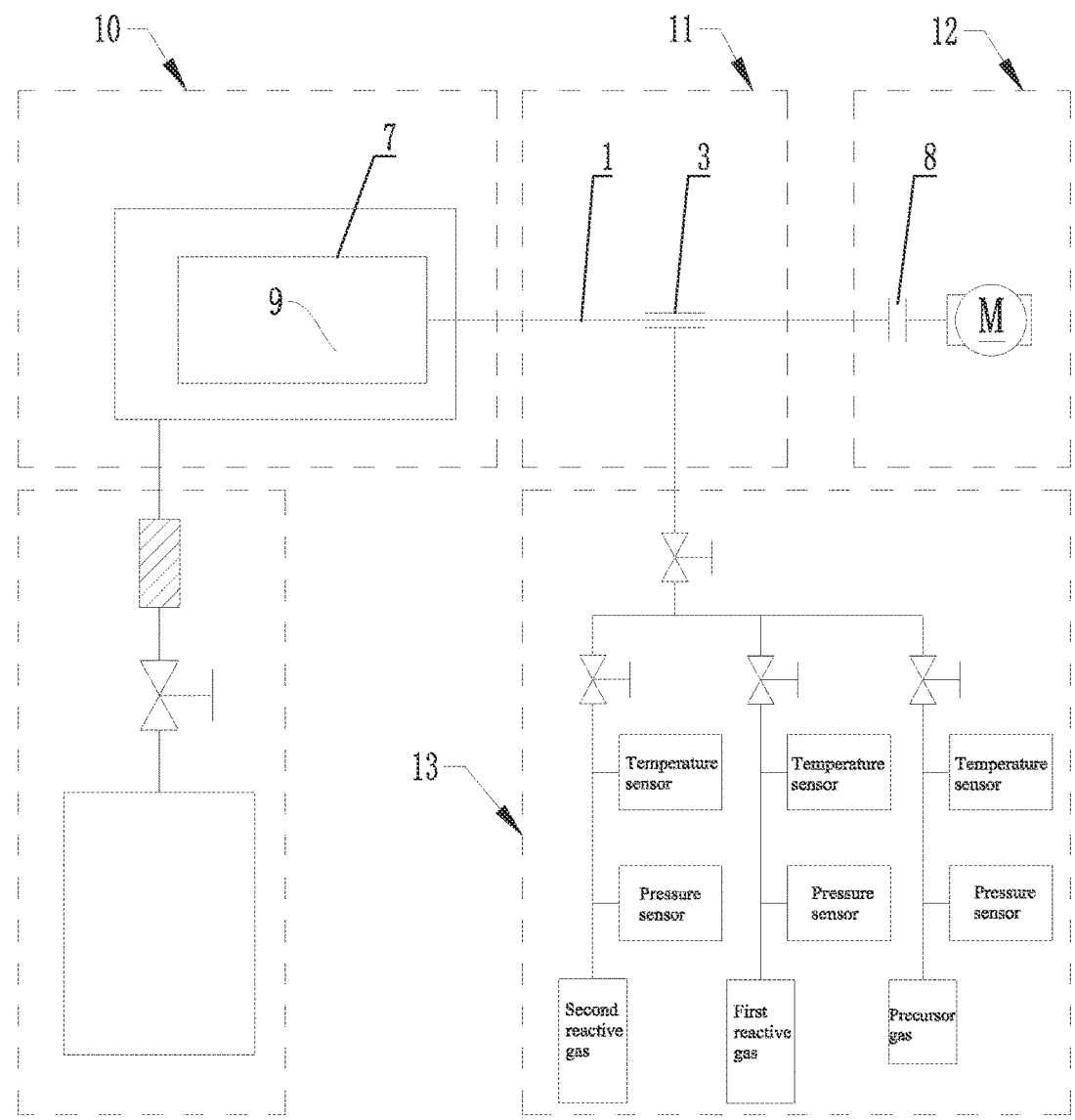
FIG. 3 is a simplified structural schematic diagram of the powder coating device according to one embodiment of the present disclosure.

Below in conjunction with the accompanying drawings and specific embodiments, the present disclosure is described in further detail:

Referring to FIGS. 1-3, one embodiment of the present disclosure provides a powder coating device, which includes a reaction device 10, a driving device 20, a gas supply device 13, and a gas delivery device 11 configured to connect an inner cylinder 7 of the reaction device 10 and the driving device 12 and further to connect a reaction chamber 9 of the inner cylinder 7 and the gas supply device 13.

The gas delivery device 11 includes a rotating shaft 1, a sleeve 3, and a pair of seals 2. The rotating shaft 1 is connected to the inner cylinder 7 and the driving device 12, and a first gas path 4 communicated with the reaction chamber 9 is defined along an axis of the rotating shaft 1, and a plurality of gas holes 5 for communicating the first gas path 4 with outside of the rotating shaft 1 are defined in the rotating shaft 1. The sleeve 3 is sleeved on the rotating shaft 1, and a second gas path 6 for the rotating shaft 1 to pass through is defined in the sleeve 3, the second gas path 6 is communicated with the gas supply device 13, and the plurality of gas holes 5 is located inside the second gas path 6. The pair of the seals 2 are disposed between the rotating shaft 1 and the sleeve 3 for sealing the second gas path 6.

Specifically, two ends of the rotating shaft 1 are respectively connected to the inner cylinder 7 and the driving device 12, the rotating shaft 1 is rotatable with respect to the sleeve 3 to transmit power of the driving device 12 to the inner cylinder 7 to rotate the inner cylinder 7. And the rotating shaft 1 is also communicated with the gas supply device 13 so that reactive gas and precursor gas from the gas supply device 13 can enter the first gas path 4 from the second gas path 6 after passing through the plurality of the gas holes 5, and entering the reaction chamber 9. The reactive gas and the precursor gas directly enter the reaction chamber 9 inside the inner cylinder 7, so as to ensure that the reactive gas can fully react on surfaces of powders, thereby achieving good practical effects.

Specifically, in the powder coating device of the present disclosure, the reactive gas and precursor gas from the gas supply device can directly enter the reaction chamber inside the inner cylinder, so as to ensure that the reactive gas can fully react on surfaces of powders, thereby achieving good practical effects and providing great practical significance.

In the embodiment, the first gas path does not penetrate the rotating shaft 1, but in other embodiments, for the convince of manufacturing, the first gas path 4 can penetrate the rotating shaft 1, and at a place where the rotating shaft 1 is connected to the driving device 12, an opening on a side of the first gas path 4 close to the driving device 12 is sealed to prevent leakage of the reactive gas. The gas delivery device can be applied in a powder coating device, especially in an Atomic Layer Deposition (ALD) powder coating device, not only power of the driving device 12 can be effectively transmitted to the inner cylinder 7, but also the precursor gas can be efficiently and directly delivered to the reaction chamber 9, which is of great practical significance.

As shown in FIG. 2, in this embodiment, the plurality of the gas holes 5 is defined along a radial direction of the rotating shaft 1, and the gas holes 5 have diameters of 1-100 mm, preferably 1-10 mm, and further preferably 5 mm. The first gas path 4 has a diameter of 1-10 mm, preferably 1-10 mm, and further preferably 10 mm. And the second gas path 6 has a diameter of 10-200 mm, preferably 10-50 mm.

Specifically, materials of the rotating shaft 1 and the sleeve 3 are selected from one of aluminum, stainless steel, copper, nickel, alumina, and zirconia ceramics. The pair of the seals 2 are selected from rubber sealing rings, metal sealing rings, plastic sealing rings, ceramic sealing rings, rubber metal sealing rings, or plastic metal sealing rings.

As shown in FIGS. 1 and 3, in this embodiment, the rotating shaft 1 is connected to a coupling 8 of the driving device 12, and the coupling 8 is a magnetic coupling or a magnetic fluid coupling. And the inner cylinder 7 is detachably connected to the rotating shaft 1, preferably in threaded connection, so that the inner cylinder 7 can be quickly installed on the rotating shaft 1.

Specifically, the driving device 12 is controlled to drive the rotating shaft 1 to rotate at a low speed, and the inner cylinder 7 rightly face the rotating shaft 1 and move towards the rotating shaft 1, so that threads are screwed into the inner cylinder 7. During the installation, there is no need to manually rotate it, which has very good practical significance.

As shown in FIGS. 4 to 7, in this embodiment, the reaction device 10 includes a cavity wall structure, the cavity wall structure is configured to receive the inner cylinder 7 capable of containing powders, and is communicated with the gas supply device 13 and a gas extraction device 2, and is further connected to the driving device 12 for driving the inner cylinder 7 to rotate.

The gas delivery device includes a rotating shaft 1 disposed in the cavity wall structure. The rotating shaft 1 passes through and is rotatably disposed on a cavity wall of the cavity wall structure from inside of the cavity wall structure. The inner cylinder 7 is disposed at an end of the rotating shaft 1, and is coaxially arranged with the rotating shaft 1. Another end of the rotating shaft 1 outside the cavity wall structure is connected to the driving device 12 in a transmission way.

Figure 4:
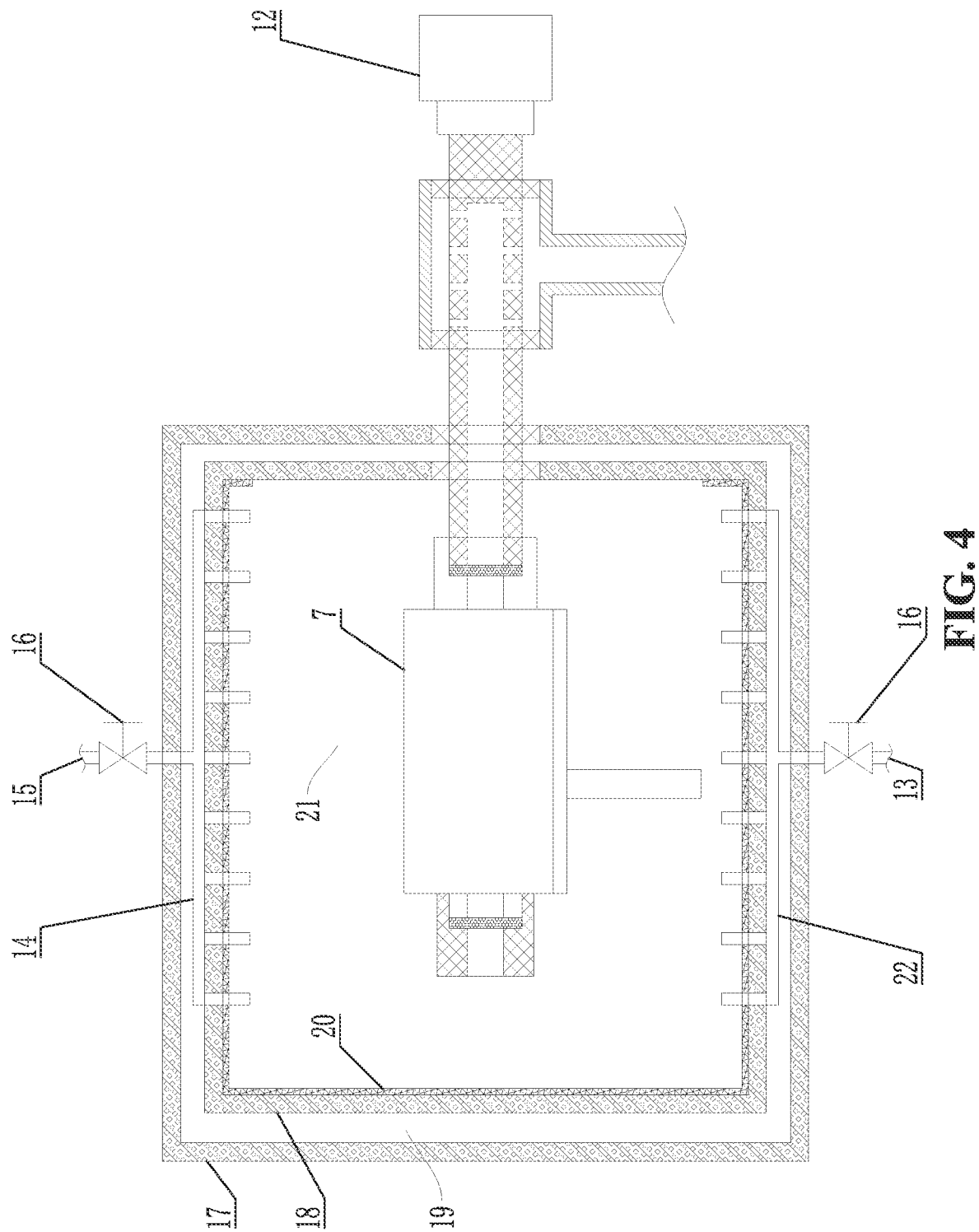
FIG. 4 is a simplified structural schematic diagram of the cavity wall structure cooperating with external devices according to one embodiment of the present disclosure.
Figure 5:
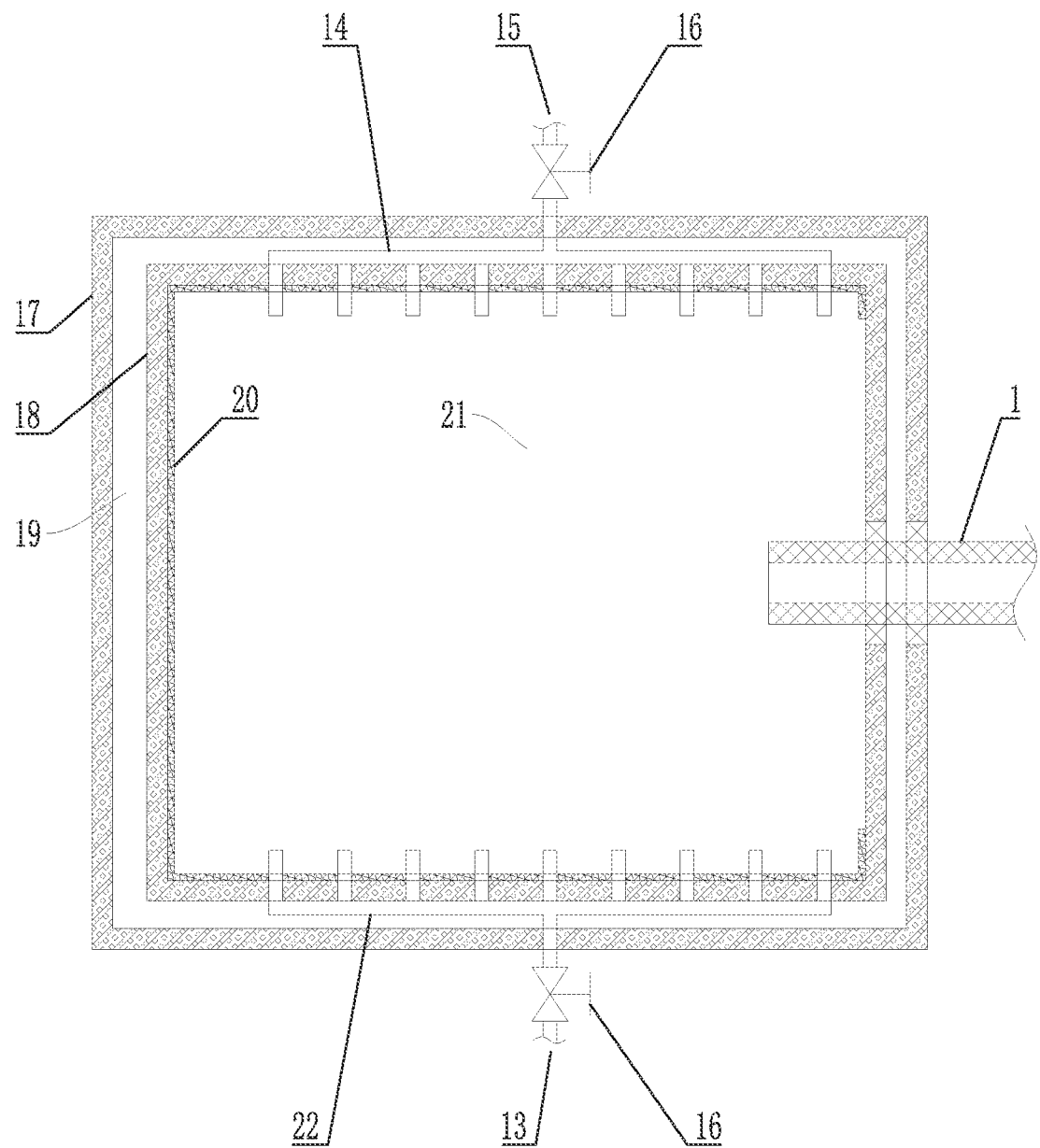
FIG. 5 is a simplified structural schematic diagram of the cavity wall structure (in which a gas inlet pipeline and a gas extraction pipeline are disposed on an inner surface of the inner wall) according to one embodiment of the present disclosure.

As shown in FIGS. 4 and 5, in this embodiment, the cavity wall structure includes an inner wall 18 having a cavity 21, an outer wall 17 disposed outside the inner wall 18 for wrapping up the inner wall 18, a heating component 20 disposed on the inner wall 18 for controlling temperature of the cavity 21, a gas inlet pipeline 22 disposed on the inner wall 18 for communicating the cavity 21 with the gas supply device 13, and a gas extraction pipeline 14 disposed on the inner wall 18 for communicating the cavity 21 with the gas extraction device 15. A material of the inner wall 18 is one of stainless steel, nickel, aluminum, tungsten, molybdenum, silicon carbide, and aluminum oxide. The cavity 21 is configured to accommodate the inner cylinder 7 to create a space for powder coating for the inner cylinder 7. The rotating shaft 1 extends from outside of the cavity wall structure into the cavity 21 after passing through the inner wall 18 and the outer wall 17. The inner cylinder 7 is coaxially disposed at the end of the rotating shaft 1, and rotates with the rotating shaft 1.

Specifically, the gas supply device 13 outputs a first reactive gas into the cavity 21 through the gas inlet pipeline 22, and chemical adsorption or chemical reaction of the first reactive gas happens on surfaces of powders. Next, the gas supply device 13 outputs inert gas to discharge the first reactive gas and first reaction by-products from the cavity 21 through the gas extraction pipeline 14, and/or extracts the first reactive gas and the first reaction by-products from the chamber 21 using the gas extraction device 15 to vacuumize the cavity 21.

Then the gas supply device 13 outputs a second reactive gas into the cavity 21 through the gas inlet pipeline 22, the second reactive gas react with the first reactive gas on the surfaces of the powders to form a coating layer. Finally, the second reactive gas and second reaction by-products are extracted from the cavity 21. During this process, the rotating shaft 1 drives the inner cylinder 7 to rotate, which can disperse the powders, and ensure that the surfaces of all of the powders can contact the two reactive gases, which ensures that the coating layers are uniform and stable.

At the same time, the heating component 20 can well control temperature inside the cavity 21, so that the first reactive gas and the second reactive gas can react at the most suitable temperatures, which greatly improves reaction efficiency and reaction quality. In other embodiment, optionally, the first reactive gas and the second reactive gas can be vapor of liquid.

Figure 6:
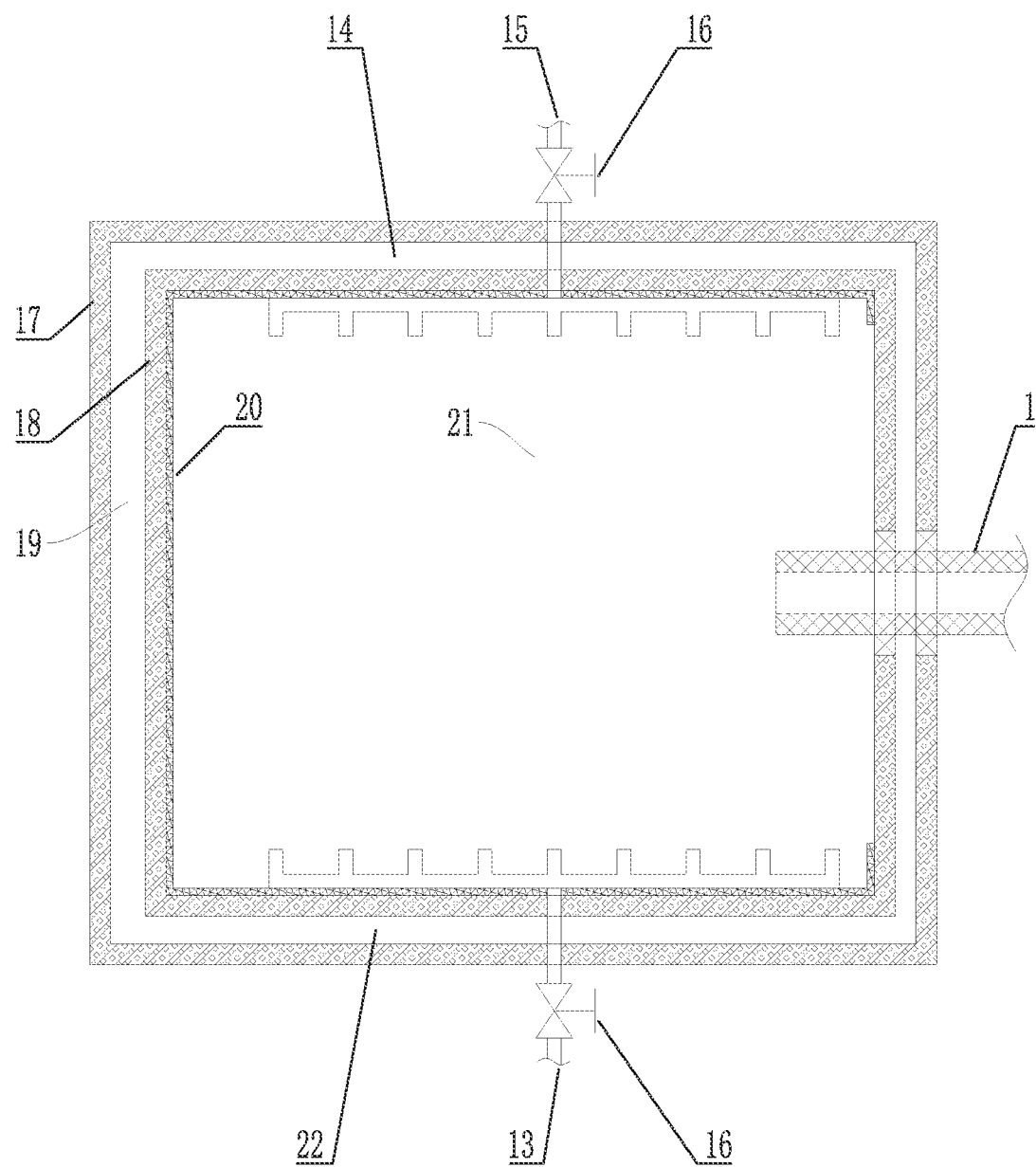
FIG. 6 is a simplified structural schematic diagram of the cavity wall structure (in which a gas inlet pipeline and a gas extraction pipeline are disposed between the inner wall and the outer wall) according to one embodiment of the present disclosure.

As shown in FIG. 6, in this embodiment, the gas inlet pipeline and the gas extraction pipeline are disposed on an inner surface of the inner wall 18. As shown in FIG. 5, in another embodiment, the gas inlet pipeline and the gas extraction pipeline are disposed between the inner wall 18 and the inner wall 17. A first end of the gas inlet pipeline 22 and a first end of the gas extraction pipeline 14 penetrate through the inner wall 18 and are communicated with the cavity 21, and a second end of the gas inlet pipeline 22 and a second end of the gas extraction pipeline 14 penetrate through the outer wall 17 and are respectively communicated with the gas supply device 13 and the gas extraction device 15, respectively. Valves are disposed on the second end of the gas inlet pipeline 22 and the second end of the gas extraction pipeline 14. A double-layer cavity wall structure is adopted as the cavity wall structure, the gas inlet pipeline 22 can be disposed between the inner wall and the outer wall, or inside the inner wall 18, which can ensure cleanliness inside the cavity 21 and it is very convenient for installation and maintenance of the powder coating device.

Figure 7:
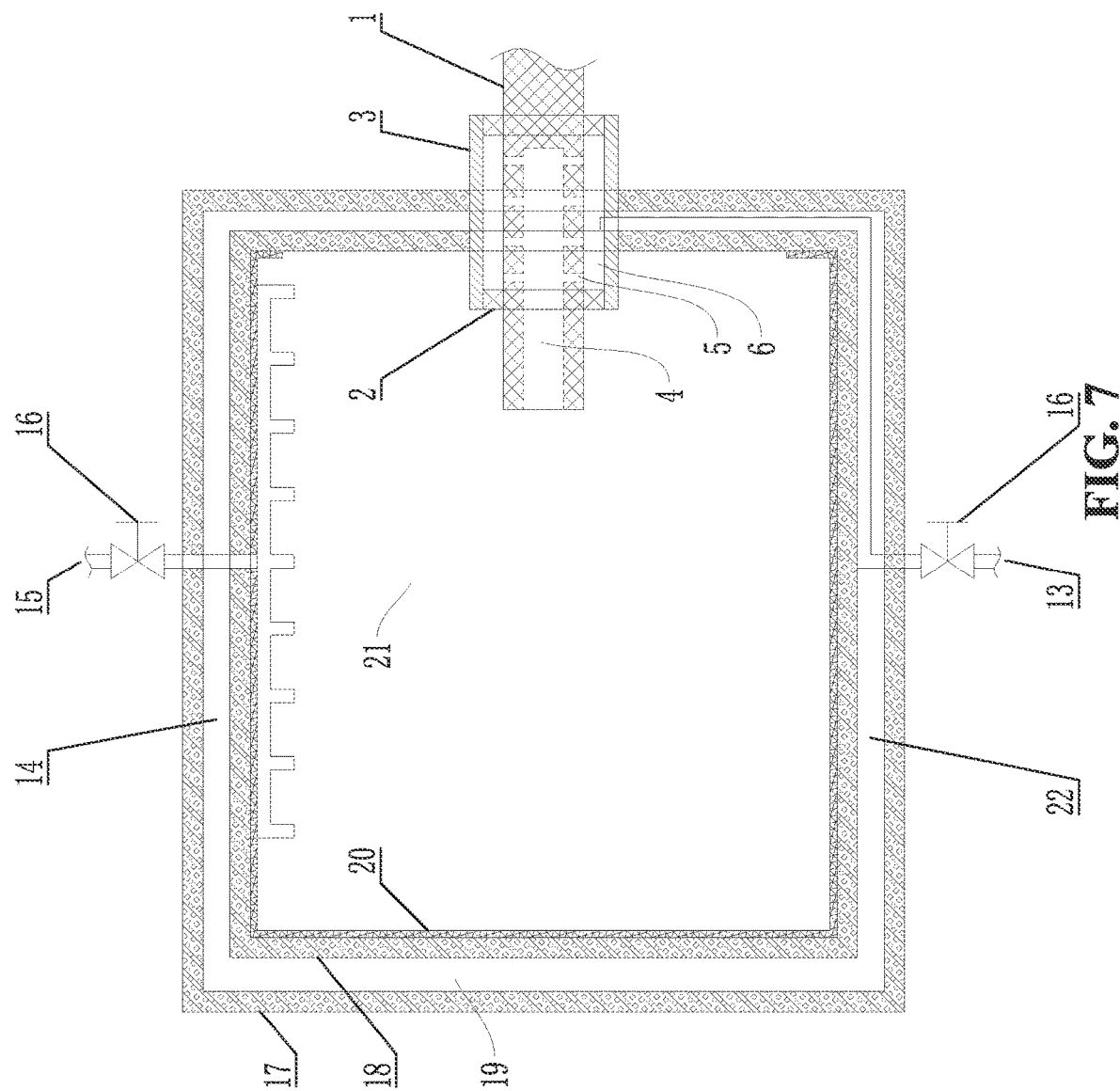
FIG. 7 is a simplified structural schematic diagram of the cavity wall structure (in which a gas inlet pipeline is disposed between the inner wall and the outer wall and connected to a first gas path inside the rotating shaft) according to one embodiment of the present disclosure.

As shown in FIG. 7, the gas inlet pipeline 22 is disposed between the inner wall 18 and the outer wall 17, a first end of the gas inlet pipeline 22 is connected to the gas supply device 13, and a second end of the gas inlet pipeline 22 is connected to the second gas path 6. By which the gas inlet pipeline 22 is connected to the reaction chamber inside the inner cylinder 7, meanwhile cleanliness inside the cavity 21 is ensured and it is very convenient for removal and installation of the inner cylinder 7, which provides good practical significance.

In this embodiment, a material of the outer wall 17 is one of stainless steel, nickel, aluminum, tungsten, molybdenum, silicon carbide, and aluminum oxide. And a vacuum layer 19 for heat insulating is disposed between the outer wall 17 and the inner wall 18. The vacuum layer 19 can not only meet the requirements of processes, but also realize the function of heat insulating. The double-layer cavity wall can reduce heat conduction to outside of the cavity wall structure, which not only saves energy, but also ensures that the heating component 20 can more accurately control the temperature inside the cavity 21. In another embodiment, there is no vacuum layer 19 disposed between the inner wall 18 and the outer wall 17, and a material of the outer wall 17 is a heat insulating material. Specifically, the heating component 20 is a resistance wire heater or an infrared heater, and is disposed on the inner surface of the inner wall 18. When the heating component 20 is a resistance wire, the heating component 20 can be disposed on the inner surface of the inner wall 18, or on an outer surface of the inner wall 18, or disposed inside the inner wall 18.

In the embodiment, openings are respectively defined in the inner wall 18 and the outer wall 17 for taking and placing the inner cylinder 7, the cavity wall structure further includes door panels for sealing the openings. Those skilled in the art generally refer vapor of solid, reactive gas or reactive vapor of liquid as precursors.

The above are merely preferable examples of the present disclosure and are not used to limit the present disclosure. For one skilled in the art, various modifications and changes may be made to the present disclosure. Any amendments, equivalent replacements, improvements and so on, made without departing from the spirit and principle of the present disclosure, shall be covered by the scope of the present disclosure.

What is claimed is:

1. A powder coating device, comprising:
   a reaction device;
   a driving device;
   a gas supply device; and
   a gas delivery device;
   wherein the gas delivery device is configured to connect an inner cylinder of the reaction device and the driving device and further to connect a reaction chamber of the inner cylinder and the gas supply device; wherein the gas delivery device comprises:
a rotating shaft;
a sleeve; and
a pair of seals;
wherein the rotating shaft is connected to the inner cylinder and the driving device, and a first gas path, communicated with the reaction chamber, is defined along an axis of the rotating shaft, and a plurality of gas hole for communicating the first gas path with outside of the rotating shaft are defined in the rotating shaft; the sleeve is sleeved on the rotating shaft, and a second gas path for the rotating shaft to pass through is defined in the sleeve, the second gas path is communicated with the gas supply device, and the plurality of the gas holes is located inside the second gas path; and the pair of the seals are disposed between the rotating shaft and the sleeve for sealing the second gas path; the rotating shaft is rotatable with respect to the sleeve and is capable of driving the inner cylinder to rotate, and gas from the gas supply device is capable of entering the first gas path from the second gas path after passing through the plurality of the gas holes, and then entering the reaction chamber.

2. The powder coating device according to claim 1, wherein the reaction device comprises a cavity wall structure, the cavity wall structure is configured to receive the inner cylinder capable of containing powders, and is communicated with the gas supply device and a gas extraction device, and is further connected to the driving device for driving the inner cylinder to rotate; and the cavity wall structure comprises:
an inner wall;
an outer wall;
a heating component;
a gas inlet pipeline; and
a gas extraction pipeline;
wherein the inner wall comprises a cavity for accommodating the inner cylinder, the outer wall is disposed outside the inner wall for wrapping up the inner wall, the heating component is disposed on the inner wall for controlling temperature of the cavity, the gas inlet pipeline is disposed on the inner wall for connecting the cavity and the gas supply device, and the gas extraction pipeline is disposed on the inner wall for connecting the cavity and the gas extraction device; reactive gas output from the gas supply device is capable of passing through the gas inlet pipeline and then enters the cavity to react on surfaces of powders, and the gas extraction device is capable of extracting the reactive gas from the cavity through the gas extraction pipeline to vacuumize the cavity.

3. The powder coating device according to claim 2, wherein the gas inlet pipeline and the gas extraction pipeline are disposed between the inner wall and the outer wall, or disposed on an inner surface of the inner wall; and
a vacuum layer for heat insulating is disposed between the outer wall and the inner wall.

4. The powder coating device according to claim 3, wherein the gas inlet pipeline and the gas extraction pipeline are disposed between the inner wall and the outer wall, and the gas inlet pipeline and the gas extraction pipeline are located in the vacuum layer, a first end of the gas inlet pipeline and a first end of the gas extraction pipeline penetrate through the inner wall and are communicated with the cavity, and a second end of the gas inlet pipeline and a second end of the gas extraction pipeline penetrate through the outer wall and are respectively communicated with the gas supply device and the gas extraction device;
valves are respectively disposed on the second end of the gas inlet pipeline and the second end of the gas extraction pipeline; and
the heating component is a resistance wire heater or an infrared heater, and is disposed on the inner surface of the inner wall.

5. The powder coating device according to claim 2, wherein the gas inlet pipeline is disposed between the inner wall and the outer wall, a first end of the gas inlet pipeline is connected to the gas supply device, and a second end of the gas inlet pipeline is connected to the second gas path.

6. The powder coating device according to claim 2, wherein openings are respectively defined on the inner wall and the outer wall for taking and placing the inner cylinder, and the cavity wall structure further comprises door panels for sealing the openings.

7. The powder coating device according to claim 1, wherein diameters of the plurality of the gas holes are 1-10 mm, a diameter of the first gas path is 1-10 m; the plurality of the gas holes is defined along a radial direction of the rotating shaft, the first gas path does not penetrate the rotating shaft, and a diameter of the second gas path is 10-50 mm.

8. The powder coating device according to claim 2, wherein materials of the rotating shaft and the sleeve are one of aluminum, stainless steel, copper, nickel, alumina, and zirconia ceramics;
the pair of the seals is one of rubber sealing rings, metal sealing rings, plastic sealing rings, ceramic sealing rings, rubber metal sealing rings, or plastic metal sealing rings; and
materials of the inner wall and the outer wall are one of stainless steel, nickel, aluminum, tungsten, molybdenum, silicon carbide, and aluminum oxide.

9. The powder coating device according to claim 1, wherein the rotating shaft is connected to a coupling of the driving device, and the coupling is a magnetic coupling or a magnetic fluid coupling.

* * * * *